United States Patent
Peng et al.

(10) Patent No.: US 8,472,198 B2
(45) Date of Patent: Jun. 25, 2013

(54) DATA CENTER WITH CABLE MANAGEMENT STRUCTURE

(75) Inventors: Wen-Tang Peng, New Taipei (TW); Yi-Liang Hsiao, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 125 days.

(21) Appl. No.: 13/228,452

(22) Filed: Sep. 9, 2011

(65) Prior Publication Data
US 2013/0027874 A1 Jan. 31, 2013

(30) Foreign Application Priority Data
Jul. 26, 2011 (TW) .............................. 100126285 A

(51) Int. Cl.
*H05K 5/00* (2006.01)
(52) U.S. Cl.
USPC ........... 361/724; 361/726; 361/727; 361/728; 361/729; 361/730
(58) Field of Classification Search
USPC ............... 361/735, 730, 679.23, 679.02, 729, 361/726, 724, 679.58, 727, 679.46, 679.01, 361/688, 699, 728
See application file for complete search history.

(56) References Cited

U.S. PATENT DOCUMENTS

| | | | |
|---|---|---|---|
| 6,522,551 B2* | 2/2003 | Hsu et al. ...................... | 361/752 |
| 7,804,690 B2* | 9/2010 | Huang et al. .................. | 361/724 |
| 2005/0083651 A1* | 4/2005 | Smith et al. ................... | 361/687 |
| 2005/0174743 A1* | 8/2005 | Downing et al. ............. | 361/725 |
| 2005/0286235 A1* | 12/2005 | Randall et al. ............... | 361/724 |
| 2009/0086441 A1* | 4/2009 | Randall et al. ............... | 361/724 |

* cited by examiner

*Primary Examiner* — Tuan T Dinh
*Assistant Examiner* — Hung Dang
(74) *Attorney, Agent, or Firm* — Altis Law Group, Inc.

(57) ABSTRACT

A data center includes a housing and a number of server units arranged in the housing. Each server unit includes a server module and a cable management member. The first ends of a number of cables are connected to the back panel of the server module. The cable management member includes a bottom plate, a front plate, and two side plates. A number of connectors are set on the front plate. The second ends of the cables are connected to the connectors. The cable management member is fixed to one side of the server module. The cables are received in a space formed between the bottom plate and the server module. The cable management member includes a first clipping portion and a second clipping portion formed at opposite sides. The housing includes a number of rails, which can slide between the first and second clipping portions.

7 Claims, 5 Drawing Sheets

DATA CENTER WITH CABLE MANAGEMENT STRUCTURE

CROSS-REFERENCE TO RELATED APPLICATION

Relevant subject matter is disclosed in a pending U.S. patent application with application Ser. No. 13/221,885, filed on Aug. 30, 2011 and entitled "DATA CENTER WITH CABLE MANAGEMENT STRUCTURE", which is assigned to the same assignee as this patent application.

BACKGROUND

1. Technical Field

The disclosure generally relates to data centers; and more particularly to a data center having a cable management structure.

A data center usually includes a plurality of connectors set on the front side of the data center. However, electronic devices, such as servers, arranged in the data center often include cables extending from backs of the electronic, and the cables easily become tangled with each other when connected to the connectors.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
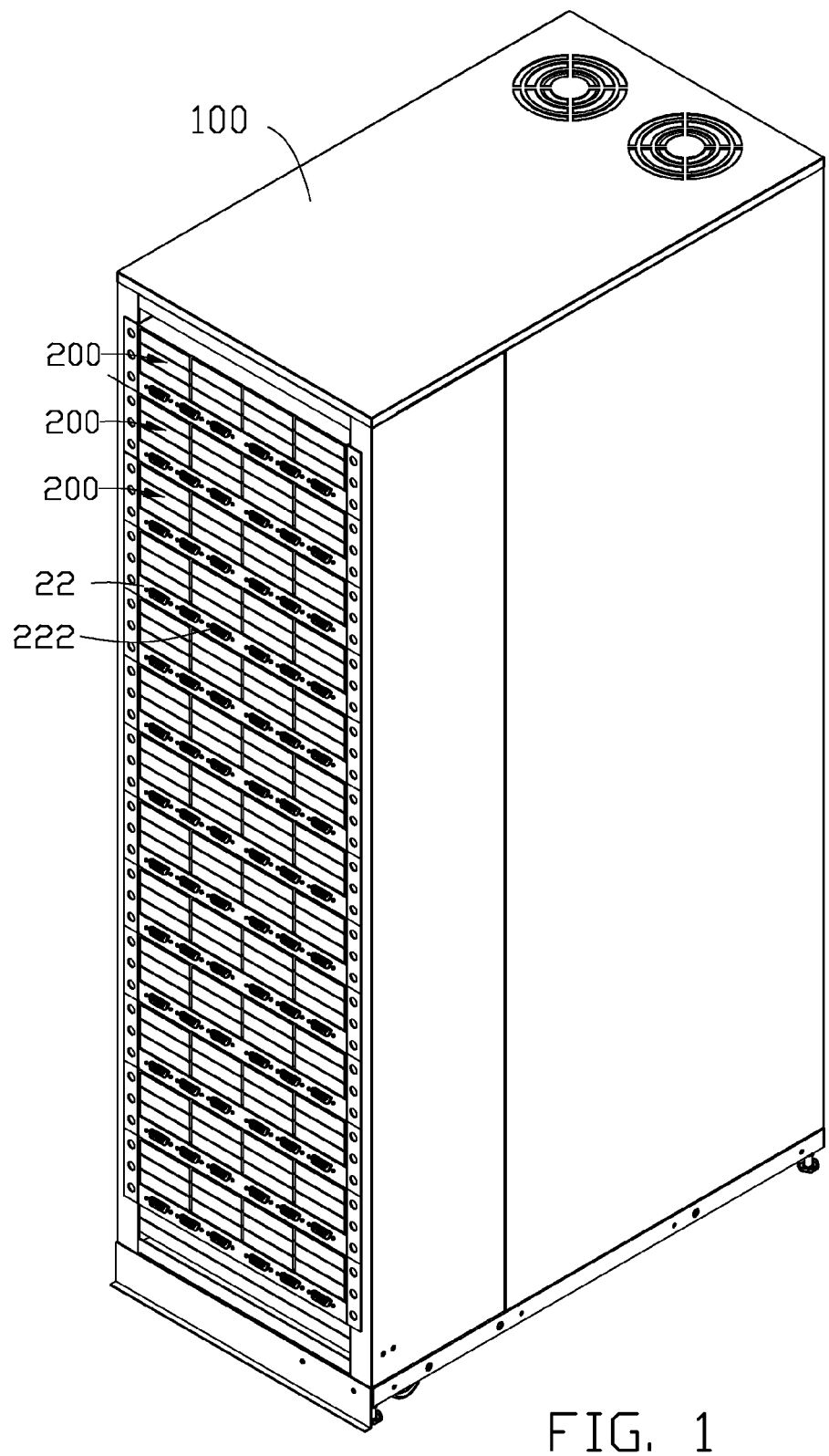
FIG. 1 is an assembled view of a data center, which includes a plurality of server units, in accordance with an embodiment.

Referring to FIG. 1, an exemplary embodiment of a data center includes a housing 100 and a plurality of server units 200 received in the housing 100.

Figure 2:
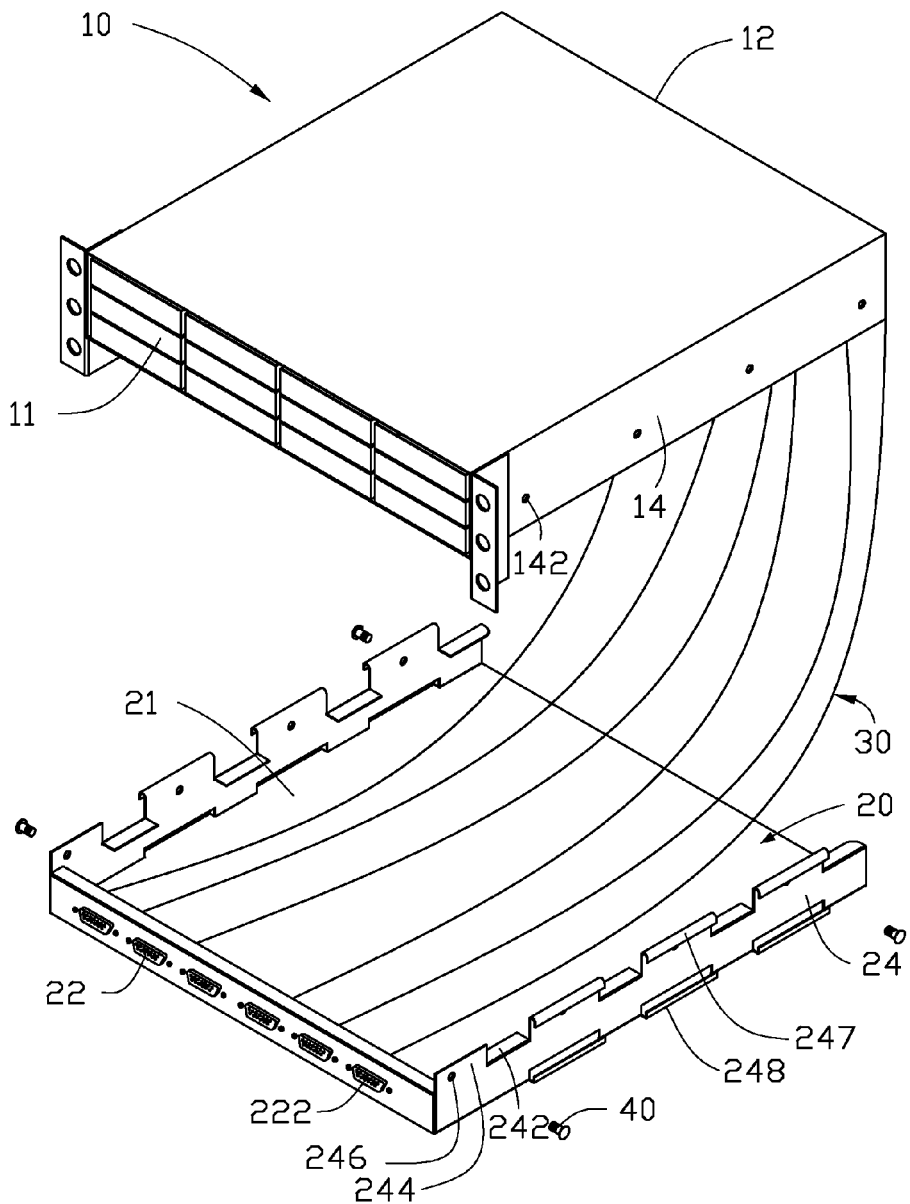
FIG. 2 is an exploded, isometric view of one of the server units of FIG. 1.
Figure 3:
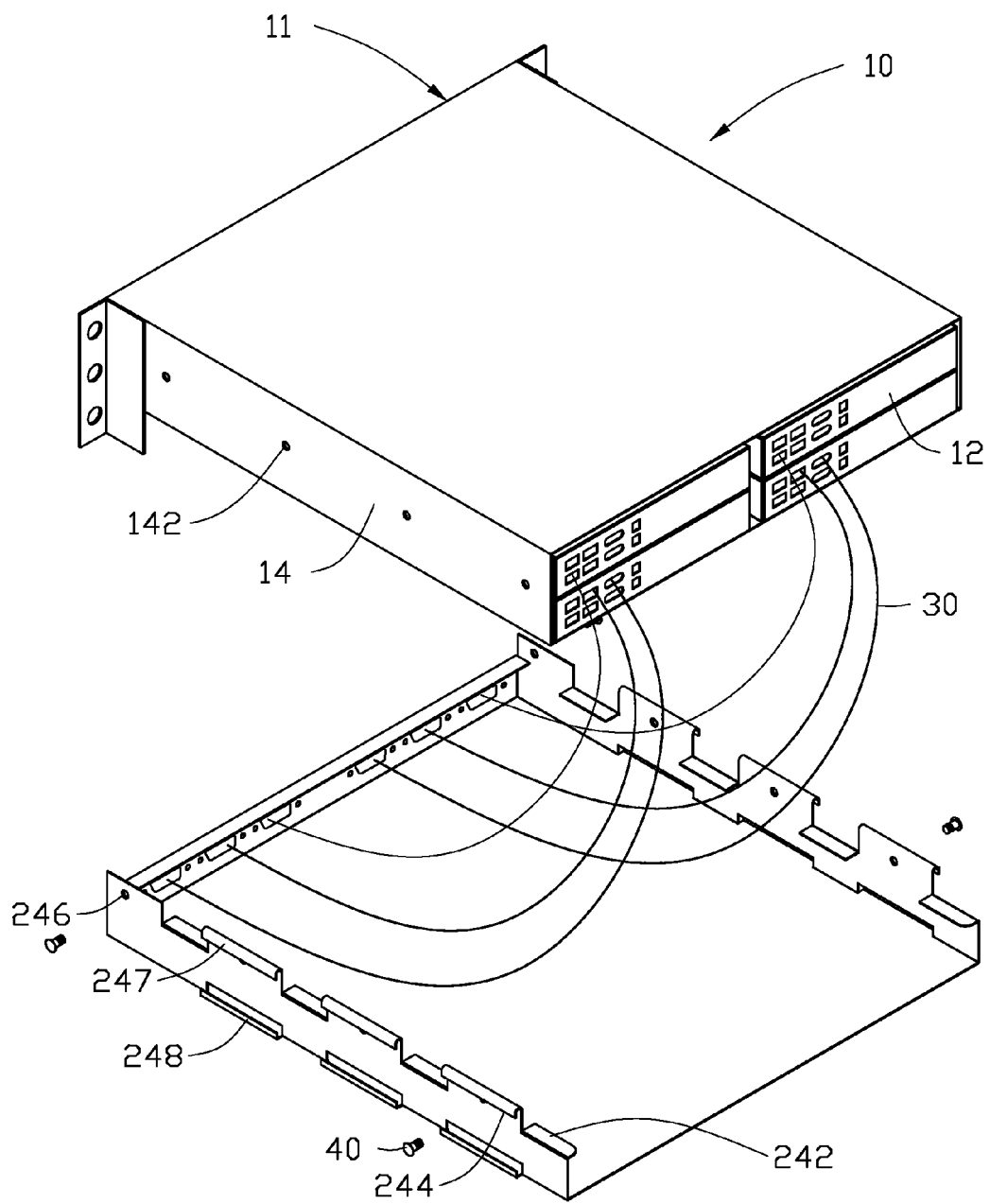
FIG. 3 is similar to FIG. 2, but viewed from a different aspect.

Referring to FIG. 2 and FIG. 3, each server unit 200 includes a server module 10 and a cable management member 20. The server module 10 includes a front panel 11, a back panel 12 electrically connected to electronic components of the server modules 10, and two opposite sidewalls 14 connected between the front panel 11 and the back panel 12. A plurality of cable 30 each includes a first end and a second end. The first ends of the cables 30 are electrically connected to the back panel 12. A plurality of mounting holes 142 is defined in the sidewalls 14.

The cable management member 20 includes a bottom plate 21, a front plate 22 extending from a front end of the bottom plate 21, and two side plates 24 extending from opposite sides of the bottom plate 21. A plurality of connectors 222 is set on the front plate 22. A plurality of supporting pieces 242 perpendicularly extends inward from a top of each side plate 24. A plurality of blocking pieces 244 extends up from the top of each side plate 24 and is arranged at intervals of every two supporting pieces 242. Each blocking piece 244 defines a through hole 246. A U-shaped first clipping portion 247 is formed extending out from a top portion of each blocking piece 244. A plurality of L-shaped second clipping portions 248 extend out from a bottom of each side plate 24. The first clipping portions 247 and the second clipping portions 248 of each side plate 24 together form a clipping space.

Figure 4:
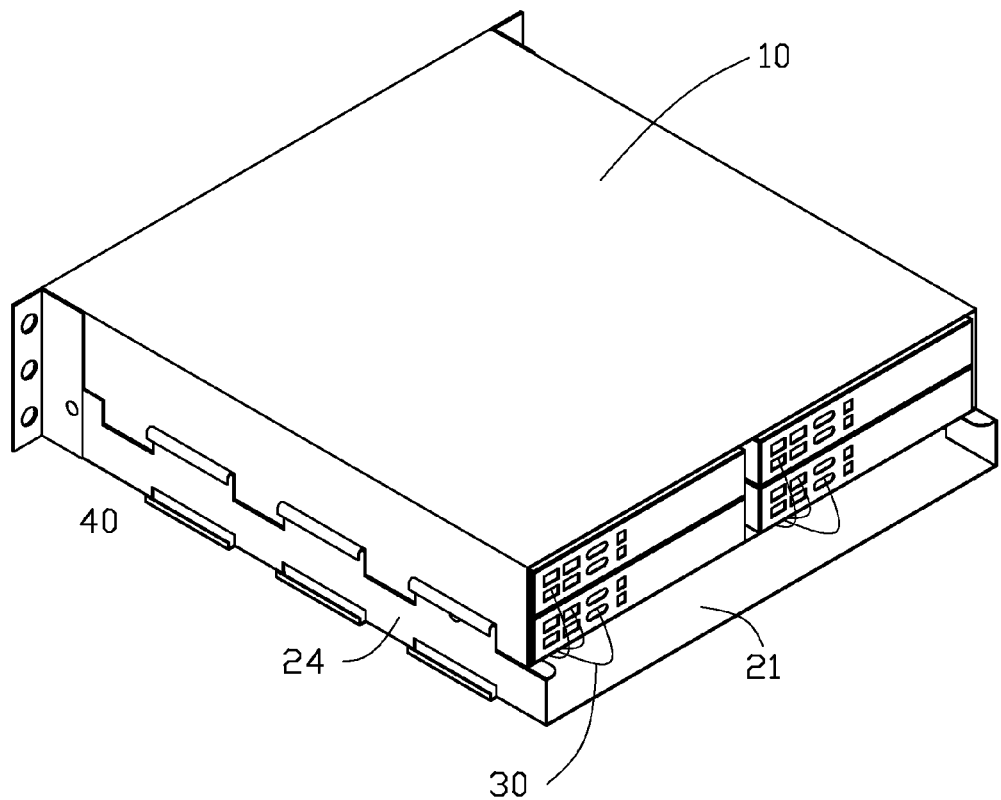
FIG. 4 is an assembled view of FIG. 3.

Referring to FIG. 4, in assembly, the second ends of the cables 30 are connected to the connectors 222. The server module 10 is supported on the supporting pieces 242 of the cable management member 20. The blocking pieces 244 block the corresponding sidewalls 14. A plurality of screws 40 extends through the through holes 246 to screw into the mounting holes 142 of the server module 10. The front plate 22 is coplanar with the front panel 11. The side plates 24 are coplanar with the sidewalls 14 respectively. The cables 30 are received in a space formed between the bottom plate 21 and the server module 10.

In other embodiments, the cable management member 20 can be fixed either to a top of the server module 10 or one sidewall 14 of the server module 10.

Figure 5:
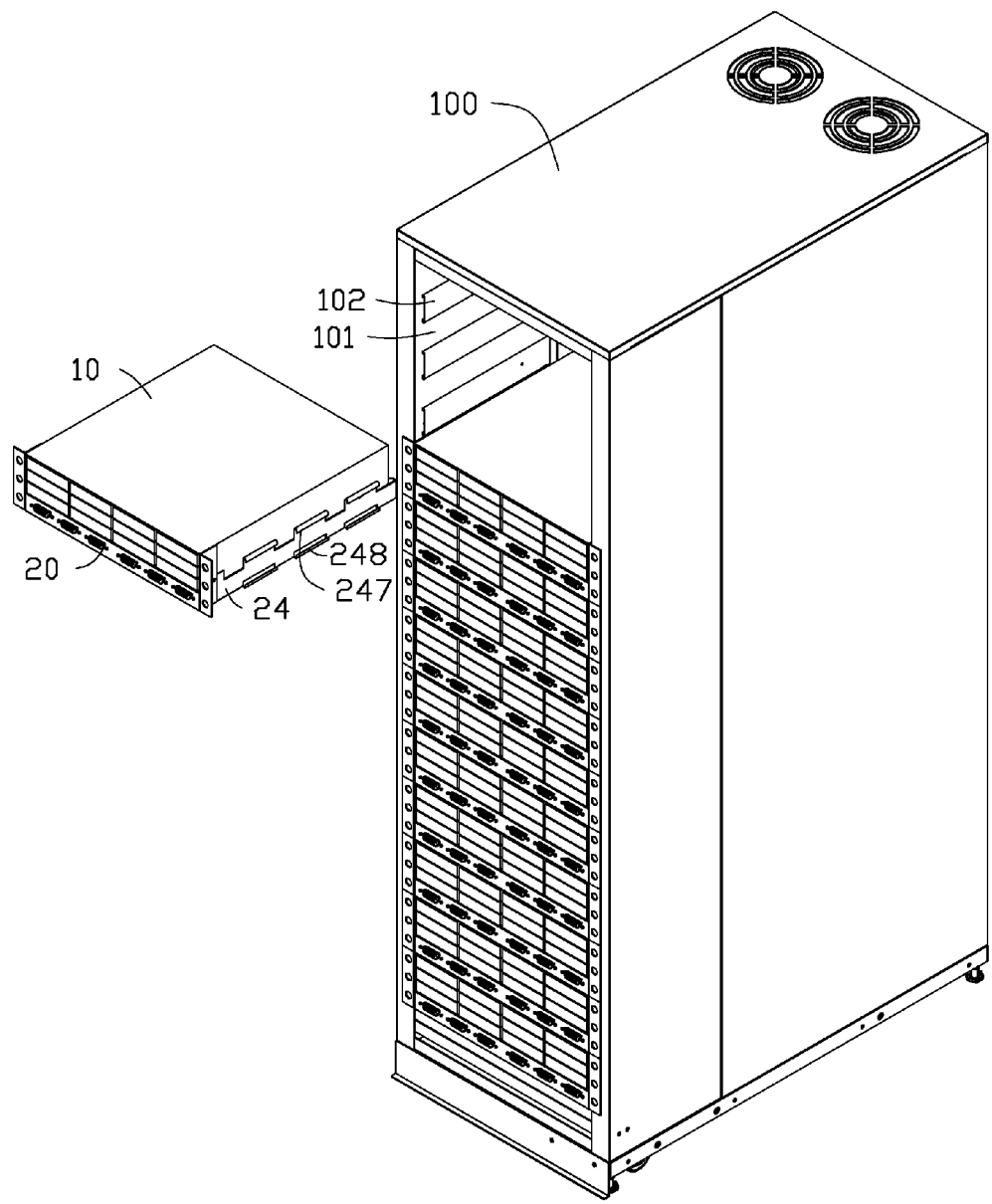
FIG. 5 is similar to FIG. 1, but showing another using state.

Referring to FIG. 5, a plurality of rails 102 are arranged on the inner surfaces 101 of the housing 100. The assembled server unit 200 is then pushed into the housing 100 along two opposite rails 102. Each of the rails 102 is slidably received between the corresponding first and second clipping portions 247, 248.

In this data center, the cables 30 extend through the cable management member 20 to connect the back panel 12 to the connectors 222 of the front plate 22, which maintains the cables 30 in an orderly manner The cable management member 20 further includes a plurality of first and second clipping portions 247, 248, which make assembly of the server unit 200 in the housing 100 convenient.

Even though numerous characteristics and advantages of the embodiments have been set forth in the foregoing description, together with details of the structure and function of the embodiments, the disclosure is illustrative only, and changes may be made in detail, especially in the matters of shape, size, and arrangement of parts within the principles of the present disclosure to the full extent indicated by the broad general meaning of the terms in which the appended claims are expressed.

What is claimed is:

1. A data center comprising:
   a housing with a plurality of rails fixed to two opposite inner surfaces of the housing; and
   a plurality of server units received in the housing, wherein each of the server units comprises a server module and a cable management member fixed to one side of the server module; the server module comprises a front panel and a back panel; the cable management member comprises a bottom plate, a front plate extending from a front end of the bottom plate and being coplanar with the front panel, and two side plates extending from opposite sides of the bottom plate, and a plurality of cables electrically connected to the back panel is received in a space formed between the bottom plate of the cable management member and the server module;
   wherein a plurality of blocking pieces extend up from each of the side plates, a first clipping portion is formed from a top portion of each of the blocking pieces, a second clipping portion extends out from a bottom of each of the side plates, and the rails of the housing are slidably received between one of the first clipping portions and a corresponding one of the second clipping portions.

2. The data center of claim 1, wherein a plurality of mounting holes are defined in the sidewalls of the server module, each of the blocking pieces defines a through hole, and a plurality of screws extends through the through holes of the blocking pieces to screw into the mounting holes of the server module.

3. The data center of claim 1, wherein the first clipping portion is U-shaped.

4. The data center of claim 1, wherein the second clipping portion is L-shaped.

5. The data center of claim 1, wherein the server module further comprises two opposite sidewalls connected between the front panel and the back panel, and the side plates are coplanar with the sidewalls respectively.

6. The data center of claim 1, wherein a plurality of supporting pieces extends inward from each of the side plates, and the server module is supported on the supporting pieces.

7. The data center of claim 1, wherein a plurality of connectors is set on the front plate, and ends of the cables are connected to the connectors.

\* \* \* \* \*